(12) United States Patent
Shizuno

(10) Patent No.: US 6,894,384 B1
(45) Date of Patent: May 17, 2005

(54) SEMICONDUCTOR DEVICE AND METHOD OF MANUFACTURING THE SAME

(75) Inventor: Yoshinori Shizuno, Kanagawa (JP)

(73) Assignee: Oki Electric Industry, Co., Ltd., Tokyo (JP)

( * ) Notice: Subject to any disclaimer, the term of this patent is extended or adjusted under 35 U.S.C. 154(b) by 213 days.

(21) Appl. No.: 09/705,729

(22) Filed: Nov. 6, 2000

(30) Foreign Application Priority Data

Nov. 11, 1999 (JP) .......................................... 11-320442

(51) Int. Cl.$^7$ .............................................. H01L 23/34
(52) U.S. Cl. ...................................................... 257/712
(58) Field of Search ................................ 257/712, 738, 257/774, 780, 706, 711, 717, 718

(56) References Cited

U.S. PATENT DOCUMENTS

| 5,572,070 A | * | 11/1996 | Ross ............................ 257/713 |
| 5,583,378 A | * | 12/1996 | Marrs et al. ................. 257/710 |
| 5,807,768 A | * | 9/1998 | Shin ............................ 438/127 |
| 5,828,127 A | * | 10/1998 | Yamagata et al. ........... 257/706 |
| 6,040,631 A | * | 3/2000 | Dibble et al. ................ 257/783 |
| 6,064,115 A | * | 5/2000 | Moscicki ..................... 257/706 |
| 6,184,580 B1 | * | 2/2001 | Lin ............................. 257/712 |

FOREIGN PATENT DOCUMENTS

JP          406216270 A    *    8/1994

* cited by examiner

*Primary Examiner*—Long Pham
*Assistant Examiner*—Dana Farahani
(74) *Attorney, Agent, or Firm*—Rabin & Berdo, PC

(57) ABSTRACT

A recessed portion of an adhesive is formed between a wiring board and a heat spreader. Voids occur in the neighborhood of the top of each metal thin wire upon curing an encapsulating resin, thus causing a reduction in moisture resistance. Therefore, the present invention provides a semiconductor device wherein a semiconductor chip and a wiring board are fixed to a heat spreader by an adhesive layer formed over a principal surface of the heat spreader, by using a method such as thermocompression bonding to thereby eliminate a recessed portion, and the parts are sealed with an encapsulating resin inclusive of the semiconductor chip and the metal thin wires.

8 Claims, 6 Drawing Sheets

SEMICONDUCTOR DEVICE AND METHOD OF MANUFACTURING THE SAME

BACKGROUND OF THE INVENTION

1. Field of the Invention

The present invention relates to a semiconductor device and a method of manufacturing the same, and particularly to a semiconductor device and a manufacturing method thereof capable of improving control on foam developed upon curing an encapsulating resin.

This application is a counterpart of Japanese Patent Application, Serial Number 320442/1999, filed Nov. 11, 1999, the subject matter of which is incorporated herein by reference.

2. Description of the Related Art

With recent high-density mounting, a semiconductor device designed in a BGA (Ball Grid Array) package described in, for example, Japanese Patent Application Laid-Open No. Hei 11-97567, wherein ball-shaped solder terminals are placed over a board or substrate mounting surface of the package in grid form, has come on the stage. With high-speed and high integration of an LSI, there has been an increasing demand for improvements in electric characteristics and heat dissipation property with respect to package mounting or implementation.

As one measure taken against it, there has been proposed a cavity down type BGA package wherein ground and power planes are placed over a multilayer printed circuit board to improve electric characteristics and a heat spreader is provided over a chip mounting surface to thereby enhance a heat dissipation property.

FIG. 8 is a cross-sectional view showing a semiconductor device designed in a conventional cavity down type BGA package.

This type of semiconductor device includes a semiconductor chip 1 on which, although not illustrated in the drawing, circuits and bonding pads are formed, a multi-layer wiring substrate or board 2 on which, although not shown in the drawing, bonding posts, circuits and through holes are formed in positions corresponding to the respective pads, a heat spreader 3 to which the semiconductor chip 1 and the wiring board 2 are fixed, metal thin wires 4 for connecting the pads and the posts respectively, and an encapsulating resin 5 for sealing the parts inclusive of the semiconductor chip 1 and the metal thin wires 4.

Solder balls 6 used as external terminals and a dam 7 are provided over the wiring board 2. Further, an opening for holding or accommodating the semiconductor chip 1 is defined in the wiring board 2. Although not shown in the drawing, the wiring board 2 is provided with ground and power planes for improving electric characteristics.

The semiconductor chip 1 is fixedly secured to the heat spreader 3 through the opening defined in the wiring board 2 with a die attach material 8 interposed therebetween. The wiring board 2 is fixedly secured to the heat spreader 3 with an adhesive 9. An organic adhesive is normally applied to the die attach material 8.

The encapsulating resin 5 such as an epoxy resin is charged up to an upper portion of the dam 7 and thereafter cured in a sealing process step. Afterwards, the solder balls 6 are fusioned so as to function as the external terminals respectively.

Defoaming is performed as needed upon charging of the encapsulating resin 5 to break or vanish foam which remain in the encapsulating resin 5, and a uniform sealed portion is formed after its curing, whereby a semiconductor device free of a reduction in reliability due to trapped moisture or the like is completed.

Incidentally, reference numeral 10 indicates a recessed portion of the adhesive 9, and reference numerals 11 indicate voids.

Since, however, the wiring board 2 and the heat spreader 3 are fixedly secured to each other with the adhesive 9 in the conventional example, the size of the mountable semiconductor chip 1 was limited in consideration of an extended-out portion of the adhesive 9.

When the width of the adhesive 9 is rendered narrow to eliminate the extended-out portion of the adhesive 9 where clearance between the semiconductor chip 1 and the wiring board 2 is less reduced due to the restriction that the body size of the package cannot be made great from a board mounting surface, and the reason of the electric characteristics of the metal thin wires 4, the recessed portion 10 is formed and foam are developed upon curing of the encapsulating resin. Thus, the foam remain as the voids 11 below narrow spatial portions of the metal thin wires 4, particularly in the neighborhood of the tops of the metal thin wires 4, whereby moisture resistance is reduced.

Further, a drawback arises in that even when the defoaming process step is introduced as a void measure, the volume of the recessed portion 10 becomes large and perfect defoaming is unfeasible, and a long time is required even if the defoaming becomes feasible, thereby causing a significant reduction in productivity.

SUMMARY OF THE INVENTION

In order to solve the above-described problems, there is provided first means wherein a semiconductor chip and a wiring board are fixed to a principal surface of a heat spreader by a layer composed of an adhesive.

There is provided second means wherein a layer composed of an adhesive having a thermal characteristic equivalent to the above adhesive is formed over a reverse surface of a heat spreader.

There is provided third means wherein a first encapsulating resin is charged below portions of metal thin wires in which voids occur, exclusive of the portions thereof to eliminate a recessed portion, and a semiconductor chip is thereafter sealed with a second encapsulating resin.

Typical ones of various inventions of the present application have been shown in brief. However, the various inventions of the present application and specific configurations of these inventions will be understood from the following description.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

First Preferred Embodiment

Figure 1:
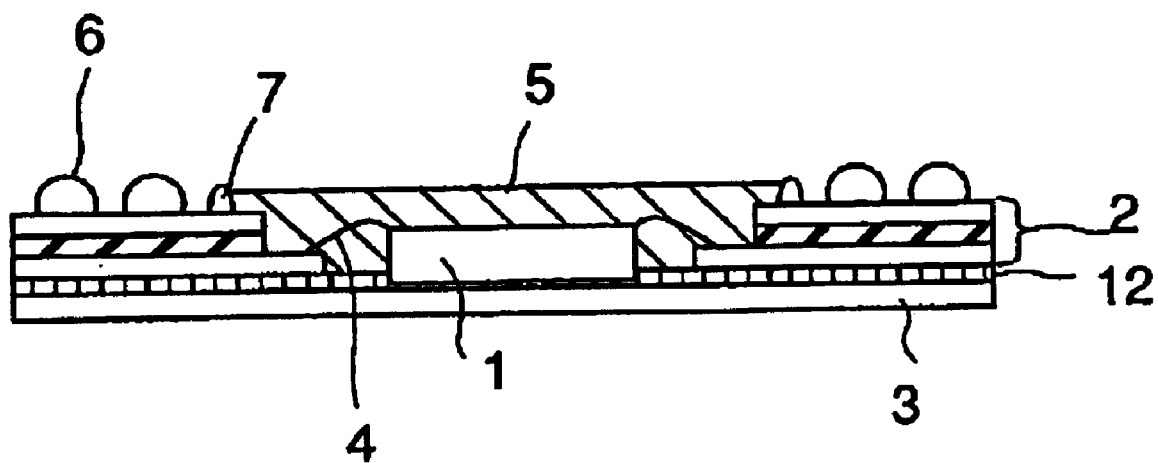
FIG. 1 is a cross-sectional view showing a semiconductor device according to a first embodiment of the present invention.
Figure 8:
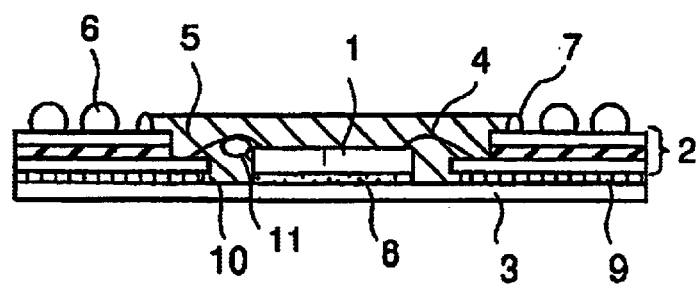
FIG. 8 is a cross-sectional view illustrating a conventional semiconductor device.

FIG. 1 is a cross-sectional view showing a first embodiment of the present invention. The same elements of structure as those employed in the prior art shown in FIG. 8 are identified by the same reference numerals.

The semiconductor device has a semiconductor chip 1, a multilayered wiring substrate or board 2, a heat spreader 3, metal thin wires 4, and an encapsulating resin 5.

Unillustrated circuits and bonding pads are formed in the semiconductor chip 1.

The wiring board 2 has a square aperture or opening defined in its central portion and a cavity defined therein, which holds or accommodates the semiconductor chip 1 therein. Although not illustrated in the drawing, bonding posts are respectively formed in positions corresponding to the respective pads of the semiconductor chip 1, and circuits and through holes are formed so as to make electrical continuity between the posts and solder balls 6 which serve as external terminals.

A layer of an adhesive, i.e., an adhesive layer 12 is formed over the entire principal surface of the heat spreader 3. The wiring board 2 is fixed to the heat spreader 3 by the adhesive layer 12. Further, the semiconductor chip 1 is also fixed to the heat spreader 3 by the adhesive layer 12 through the above-described opening in a manner similar to above.

The semiconductor chip 1 and the wiring board 2 are electrically connected to each other by bonding the pads and posts to one another with the metal thin wires 4.

The semiconductor chip 1 and the metal thin wires 4 are encapsulated by filling the opening with the encapsulating resin 5 up to an upper portion of a dam 7. The solder balls 6 are fusioned after it has been cured.

Incidentally, the solder balls 6 can be omitted if solder joining is made possible by, for example, the supply of soldering paste upon board mounting. Further, the dam 7 can be also deleted if the thickness of the wiring board 2 is sufficiently ensured and no metal thin wires 4 are exposed after encapsulation.

A B-staged thermosetting resin (whose curing has been stopped in the course thereof without reaching the final stage), a thermoplastic resin, a mixed material of the B-staged thermosetting resin and the thermoplastic resin, etc. can be applied to the adhesive layer 12.

For example, a B-staged epoxy resin used as the B-staged thermosetting resin needs care such as the need for cold storing processing to manage its reaction probability. However, the B-staged epoxy resin can be expected to have high adhesion. Further, the thermoplastic resin is easy to handle, and the mixed material has characteristics of the two referred to above.

While the semiconductor chip 1 is fixedly secured to the heat spreader 3 by the adhesive layer 12 rather than with the conventional die attach material, a high thermal-conductive adhesive is also known and can be also set to the same thermal conductivity as the die attach material. Even in the case of the die attach material and the adhesive, no serious influence occurs in terms of a heat dissipation property of a package.

According to the first embodiment as described above, since the semiconductor chip 1 and the wiring board 2 are fixed to the heat spreader 3 by the adhesive layer 12 provided over the entire principal surface of the heat spreader 3, the conventional recessed portion of adhesive does not occur between the wiring board 2 and the heat spreader 3, so that voids can be prevented from occurring in an encapsulating process step.

Further, since no voids occur even if clearance between the semiconductor chip 1 and the wiring board 2 is reduced, the optimum structure can be brought about in which priority is given to electric characteristics such as the impedance characteristic of each metal thin wire 4, thus making it possible to implement a semiconductor device excellent in electric characteristics and moisture resistance.

Figure 2:
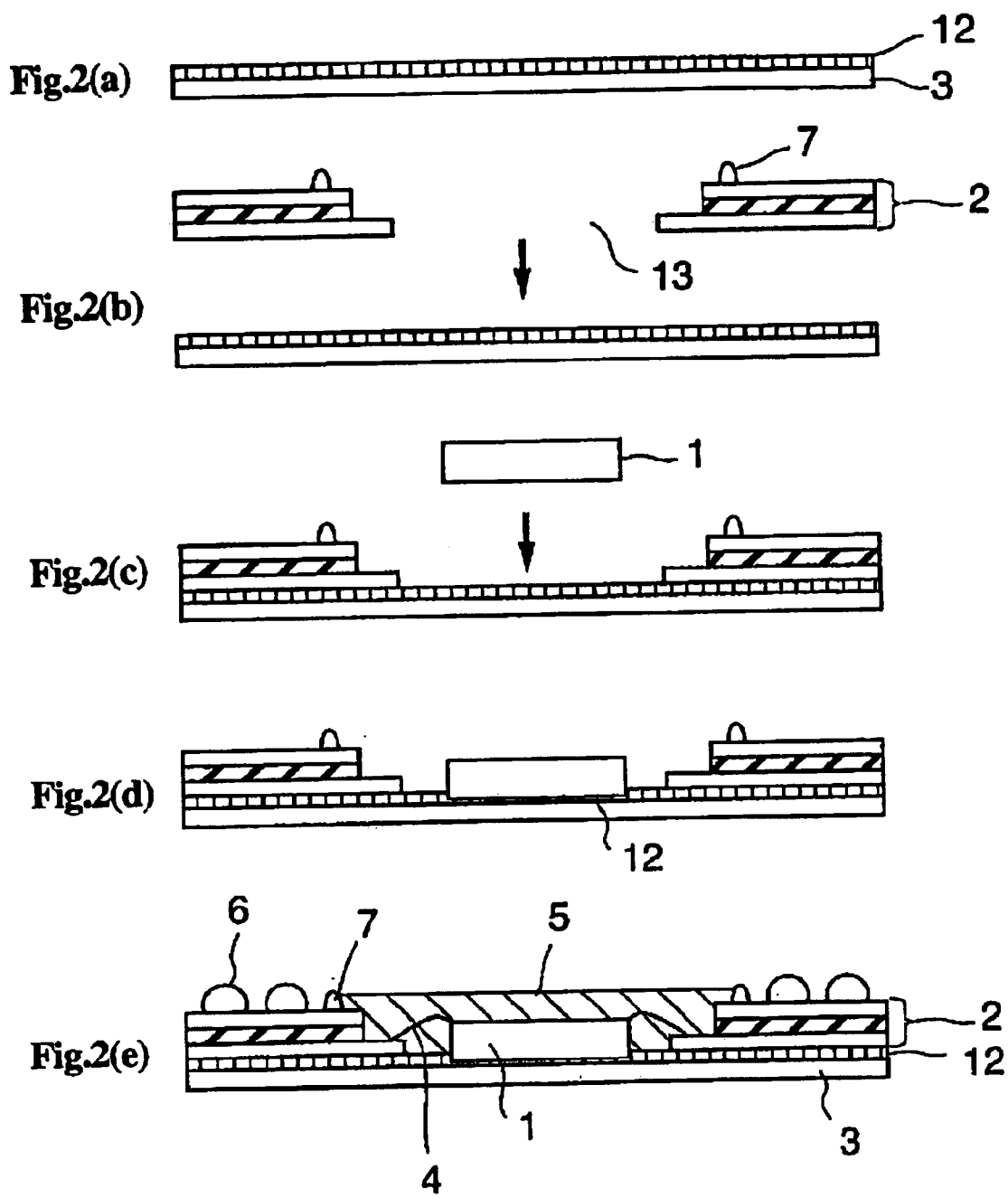
FIG. 2 is a view illustrating a method of manufacturing the semiconductor device according to the first embodiment.

FIG. 2 is a view illustrating a method of manufacturing a semiconductor device according to the first embodiment. Respective process steps are shown in the form of cross-sectional views.

A semiconductor chip 1, a wiring substrate or board 2 provided with an aperture or opening 13 for accommodating the semiconductor chip 1 therein and a dam 7, and a heat spreader 3 are first prepared.

In a process step (a), an adhesive layer 12 is formed over the entire principal surface of the heat spreader 3. An adhesive may be either a paste-like one or a sheet-like one.

In a process step (b), the wiring board 2 is aligned with the heat spreader 3 with the adhesive layer 12 formed thereon. Thereafter, the wiring board 2 is fixed onto the principal surface of the heat spreader 3 by a method such as thermocompression bonding.

When the semiconductor chip 1 is fixed onto the principal surface of the heat spreader 3 formed with the adhesive layer 12 by the method such as the thermocompression bonding after the semiconductor chip 1 has been aligned through the opening 13 defined in the wiring board 2 in a process step (c), a state shown in a process step (d) is reached.

In a process step (e), pads used for the semiconductor chip 1 and posts used for the wiring board 2 are bonded to one another by metal thin wires 4 respectively. An encapsulating resin 5 is charged into the dam 7 up to its upper portion and then cured to thereby seal the parts inclusive of the semiconductor chip 1 and the metal thin wires 4. Thereafter, solder balls 6 are fusion-bonded, thus leading to completion of the first embodiment.

According to the method of manufacturing the semiconductor device according to the first embodiment as described above, since the semiconductor chip 1 and the wiring board 2 are fixed onto the principal surface of the heat spreader 3 by the adhesive layer 12 formed over the entire surface of the heat spreader 3, no conventional recessed portion occurs between the wiring board 2 and the heat spreader 3 and voids can be prevented from occurring in the sealing process step. Thus, a defoaming process step becomes unnecessary and hence productivity is improved.

Further, since the adhesive layer 12 is used to fix the semiconductor chip 1, the conventionally-used die attach material becomes unnecessary. Although it was necessary to process the adhesive in frame form for fixing the wiring board, this process step can be deleted, thus leading to a reduction in cost.

Incidentally, since the portions cut when the adhesive is processed into frame form, are discarded, an increase in the adhesive to be used is limited by a portion corresponding to the non-need of the die attach material.

Second Preferred Embodiment

Figure 3:
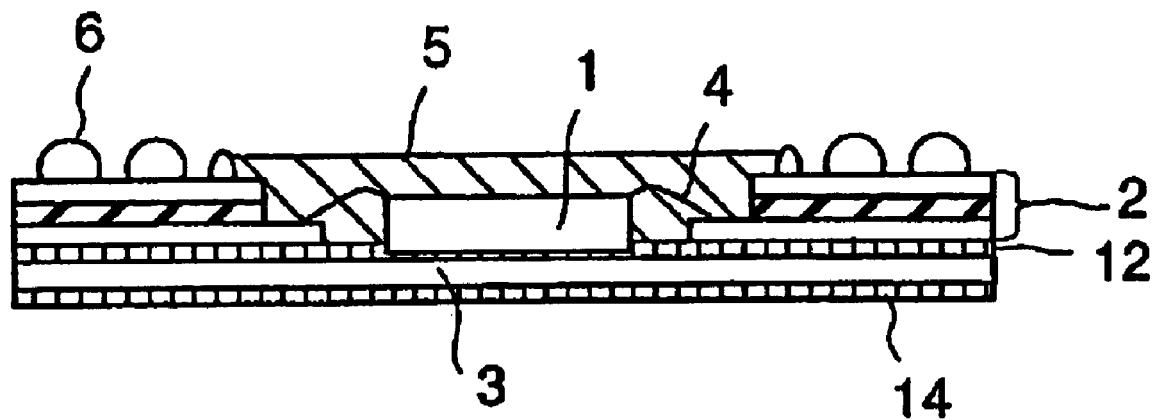
FIG. 3 is a cross-sectional view depicting a semiconductor device according to a second embodiment of the present invention.

FIG. 3 is a cross-sectional view showing a second embodiment of the present invention. The second embodiment is equivalent to one wherein a second adhesive layer 14 is further formed over the reverse surface of the heat spreader 3 in the first embodiment.

Since the second adhesive layer 14 is identical to the adhesive layer 12 formed over the principal surface of the heat spreader 3 in terms of a thermal characteristic such as a linear expansion coefficient, the same one may of course be used.

According to the second embodiment as described above, since the adhesive layers 12 and 14 are identical in thermal characteristic and are formed over the principal surface and reverse side of the heat spreader 3, in addition to the effect obtained in the first embodiment, warpage can be reduced even if the heat spreader 3 and the adhesive layers 12 and 14 are different in thermal expansion characteristic from one another. It is thus possible to realize a semiconductor device wherein a wiring board 2 and the heat spreader 3 have good adhesive properties and a reduction in warpage is reached.

Figure 4:
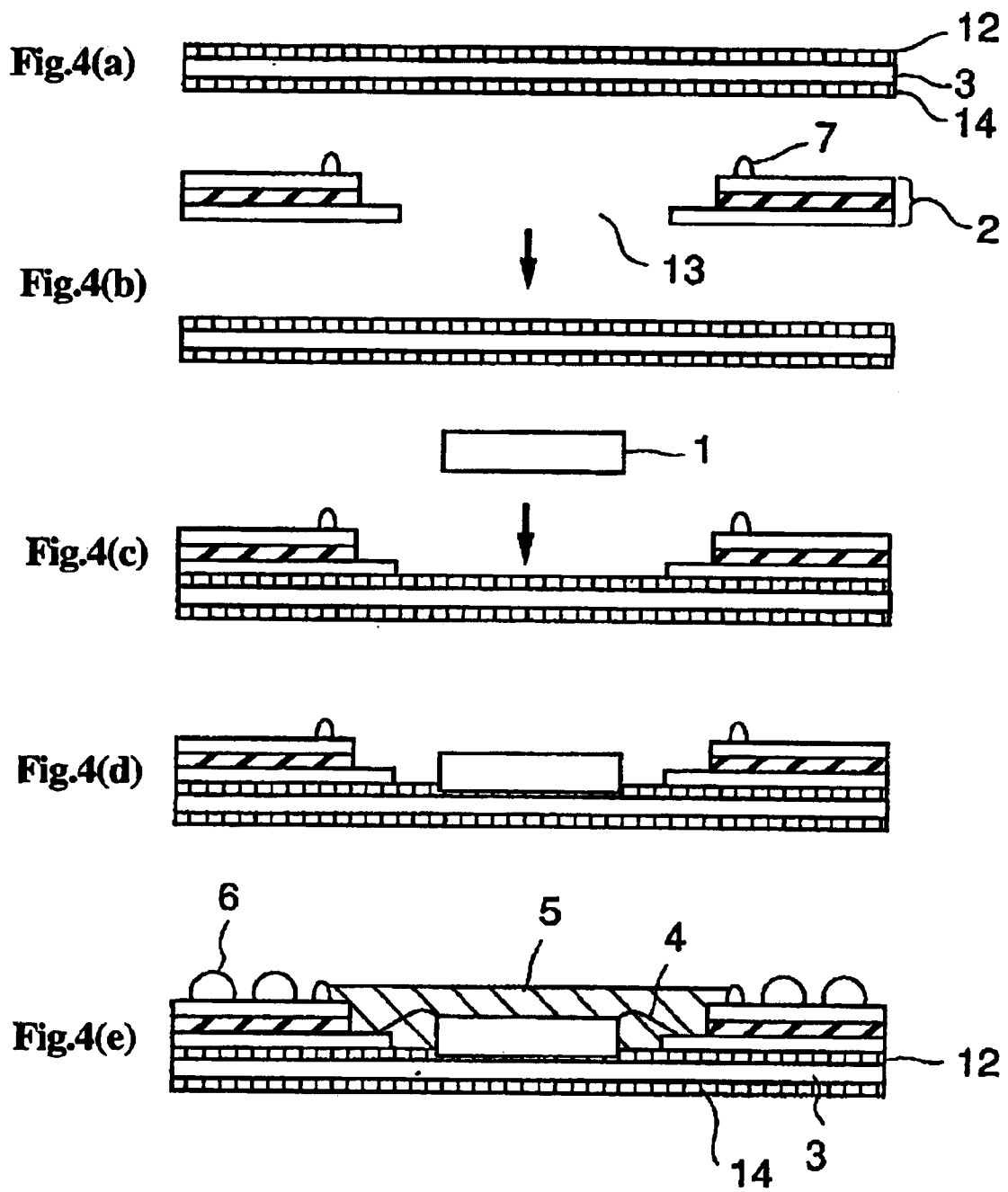
FIG. 4 is a view showing a method of manufacturing the semiconductor device according to the second embodiment.

FIG. 4 is a view showing a method of manufacturing a semiconductor device according to the second embodiment. Respective process steps are shown in the form of cross-sectional views respectively.

A semiconductor chip 1, a wiring substrate or board 2 provided with an aperture or opening 13 and a dam 7, and a heat spreader 3 are first prepared.

In a process step (a), an adhesive layer 12 is formed over the entire principal surface of the heat spreader 3, and a second adhesive layer 14 is formed over the entire reverse surface of the heat spreader 3. An adhesive may be either a paste-like one or a sheet-like one. Further, different materials identical in thermal characteristic although identical in material quality may be used as the adhesive.

In a process step (b), the wiring board 2 is aligned with the heat spreader 3 with the adhesive layer 12 formed thereon. Thereafter, the wiring board 2 is fixed onto the principal surface of the heat spreader 3 with the adhesive layer 12 formed thereon, by a method such as thermocompression bonding.

When the semiconductor chip 1 is fixed onto the principal surface of the heat spreader 3 by the method such as the thermocompression bonding after the semiconductor chip 1 has been aligned through the opening. 13 defined in the wiring board 2 in a process step (c), a state shown in a process step (d) is reached.

In a process step (e), the semiconductor chip 1 and the wiring board 2 are bonded to one another by metal thin wires 4 respectively. An encapsulating resin 5 is charged into the dam 7 up to its upper portion and then cured to thereby seal the parts inclusive of the semiconductor chip 1 and the metal thin wires 4. Thereafter, solder balls 6 are fusion-bonded, thus leading to completion of the first embodiment.

According to the method of manufacturing the semiconductor device according to the second embodiment as described above, since the second adhesive layer 14 can be formed over the reverse surface of the heat spreader 3 together with the process step for forming the adhesive layer 12 over the principal surface thereof in addition to the effect obtained by the method of manufacturing the semiconductor device according to the first embodiment, an additional adhesive and a process step therefor are unnecessary when a radiating fin or the like is fixed to the reverse surface of the heat spreader 3, and the entire process can be simplified.

Third Preferred Embodiment

Figure 5:
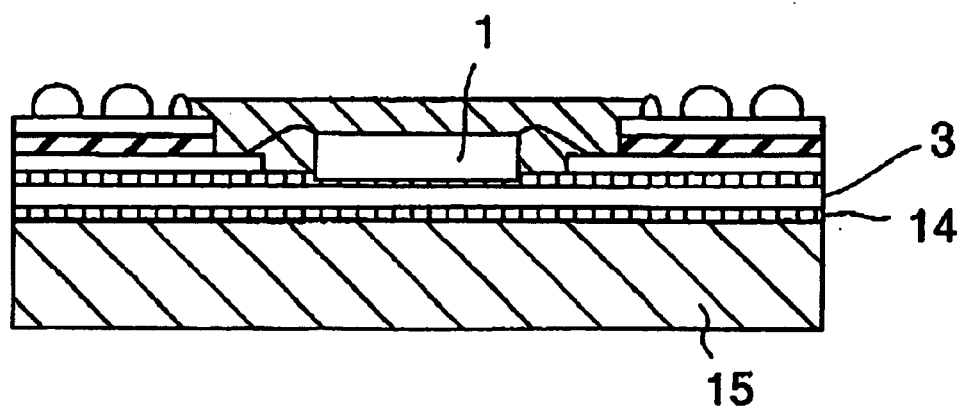
FIG. 5 is a cross-sectional view illustrating a semiconductor device according to a third embodiment of the present invention.
Figure 6A:
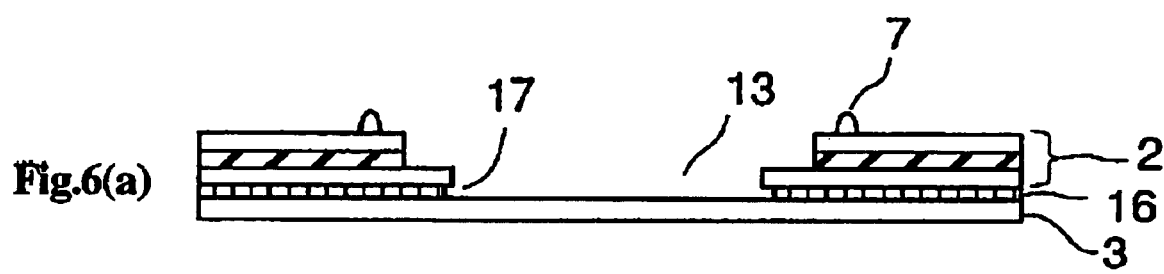
FIG. 6 is a cross-sectional view depicting a semiconductor device according to a fourth embodiment of the present invention.
Figure 6B:
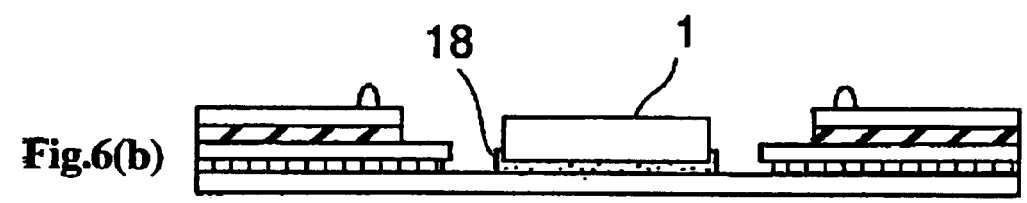
Figure 6C:
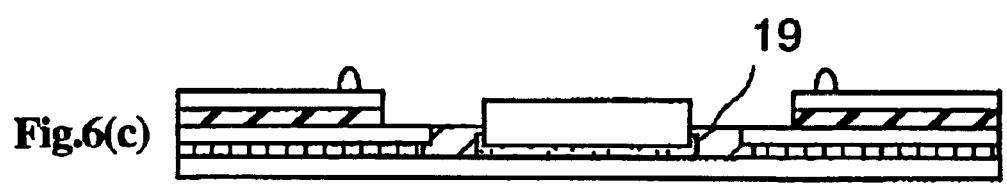
Figure 6D:
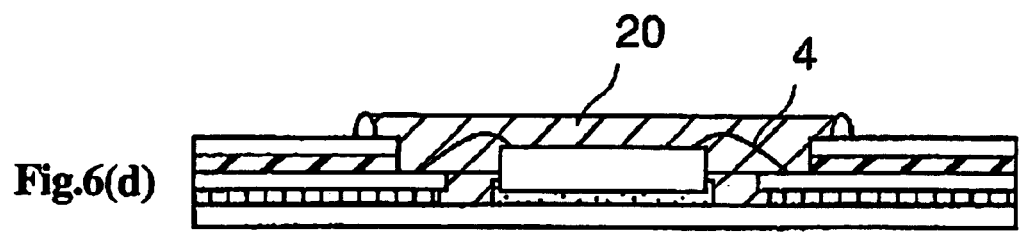
Figure 7A:
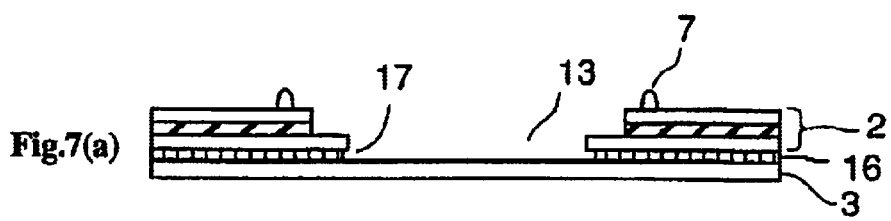
FIG. 7 is a cross-sectional view showing a semiconductor device according to a fifth embodiment of the present invention.
Figure 7B:
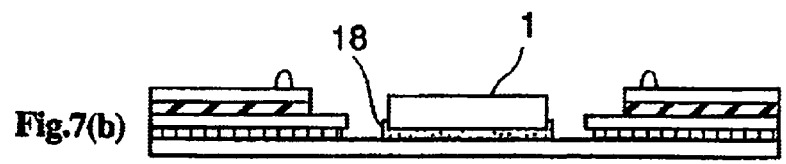
Figure 7C:
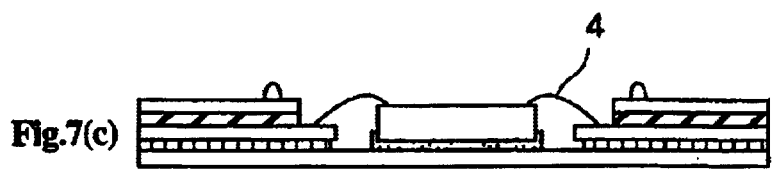
Figure 7D:
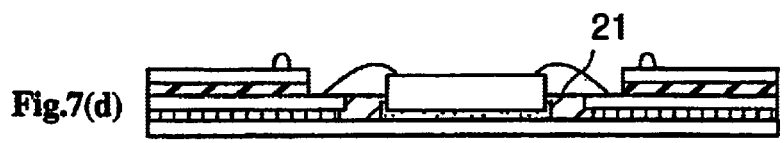
Figure 7E:
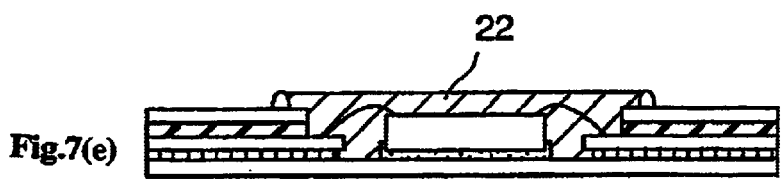

FIG. 5 is a cross-sectional view showing a third embodiment of the present invention. The present embodiment is one wherein a radiating fin 15 is fixedly secured to the second embodiment.

The radiating fin 15 is fixed to a heat spreader 3 by a second adhesive layer 14 formed over the reverse surface of the heat spreader 3 according to a method such as thermocompression bonding.

According to the third embodiment as described above, the provision of the radiating fin 15 permits the enhancement of a radiation effect.

Fourth Preferred Embodiment

FIG. 6 is a view showing a fourth embodiment of the present invention. Respective process steps are shown in the form of cross-sectional views respectively.

A semiconductor chip 1, a wiring board 2 provided with an opening 13 and a dam 7, and a heat spreader 3 are first prepared.

In a process step (a), a frame-shaped first adhesive layer 16 is formed over the principal surface of the heat spreader 3. The wiring board 2 is fixed to the heat spreader 3 with the first adhesive layer 16 interposed therebetween.

At this time, the first adhesive layer 16 is formed so as to be narrower than the wiring board 2 in width to avoid an extended-out portion thereof. However, a recessed portion 17 of an adhesive occurs due to such formation.

In a process step (b), a second adhesive layer 18 is formed over the principal surface of the heat spreader 3 through the opening 13 defined in the wiring board 2. Afterwards, the semiconductor chip 1 is mounted over the second adhesive layer 18. The process steps used until now are substantially the same as the conventional ones.

Incidentally, when a thermosetting resin is used as the second adhesive layer 18, it can be cured together in the following process step. It is thus possible to omit a curing process step for fixing the semiconductor chip 1.

In a process step (c), a first encapsulating resin 19 is charged into and cured within the opening 13 of the wiring board 2, which is located below bonding surfaces of the semiconductor chip 1 and the wiring board 2, i.e., the existing surfaces of both pads of the semiconductor chip 1 and posts of the wiring board 2 in such a manner that the recessed portion 17 is hidden. Namely, the second adhesive layer 18 and part of the semiconductor chip 1 are sealed with the first encapsulating resin.

Since the bonding surface of the wiring board 2 is lower than that of the semiconductor chip 1 in the present embodiment, the first encapsulating resin 19 is charged up to a surface slightly lower than the bonding surface of the wiring board 2.

If done in this way, then no voids occur in the pads and posts requiring moisture resistance even if the recessed portion 17 is formed between the wiring board 2 and the heat spreader 3. The voids are developed only below the pads and posts. Since, however, the portion below them is cured, no influence is exerted on the reliability of the semiconductor device.

In a process step (d), the pads and posts are bonded to one another by metal thin wires respectively. Thereafter, a second encapsulating resin 20 is charged into the dam 7 up to its upper portion and then cured to thereby seal the parts inclusive of the semiconductor chip 1 and the metal thin wires 4. Incidentally, solder balls are omitted.

The first encapsulating resin 19 may satisfy sealing characteristics such as viscosity, curing speed, etc. at a temperature for charging the encapsulating resin. Alternatively, one identical in composition to the second encapsulating resin such as an epoxy resin may be selected.

If a filler having good thermal conductivity, e.g., an organic adhesive charged with silver is used for the second adhesive layer 18, then a heat dissipation property can be also improved.

According to the fourth embodiment as described above, the semiconductor chip 1 is placed over the principal surface of the heat spreader 3. Thereafter, the first encapsulating resin 19 is charged into and cured within the opening 13 located below the bonding surfaces of the semiconductor chip 1 and the wiring board 2, followed by bonding with the metal thin wires 4. Next, the parts are sealed with the second encapsulating resin 20 inclusive of the semiconductor chip 1 and the metal thin wires 4. Therefore, no voids occur in the pads and posts subjected to the wire bonding.

Further, since the members identical in structure to those employed in the conventional semiconductor device can be used, the effect of reducing the cost of each member can be expected owing to their standardization.

Fifth Preferred Embodiment

FIG. 7 is a view showing a fifth embodiment of the present invention. Respective process steps are shown in the form of cross-sectional views respectively.

Since the present embodiment is identical to the fourth embodiment shown in FIG. 6 up to the process steps (a) and (b), their description will be omitted.

In a process step (c), pads provided within a semiconductor chip 1 and posts provided within a wiring board 2 are connected to one another by metal thin wires 4 respectively.

In a process step (d), a first encapsulating resin 21 is charged into and thereafter semi-cured within a lower opening 13 except for the neighborhood of the tops of the metal thin wires 4 at which voids are easy to remain, in such a manner that a recessed portion 17 is hidden.

One, which meets a sealing characteristic, may be used as the first encapsulating resin 21. Further, the semi-curing means that the first encapsulating resin 21 is cured up to viscosity corresponding to such an extent that at least the voids cannot be moved.

In a process step (e), a second encapsulating resin 22 is charged into a dam 7 up to its upper portion and then cured together with the first encapsulating resin 21 to thereby seal the parts inclusive of the semiconductor chip 1 and the metal thin wires 4. Incidentally, solder balls 6 are omitted.

Allowing the passage of the conventional sealer two times makes it possible to cope with the above-described semi-curing and curing process steps. Namely, the first encapsulating resin 21 is supplied in the first time and thereafter semi-cured in a heating zone of the sealer. In the second time, the second encapsulating resin 22 may be supplied and thereafter cured.

In this case, if the second encapsulating resin 22 has such a characteristic as to be sufficiently cured up to the viscosity corresponding to such an extent that at least the voids cannot be moved in the heating zone of the sealer, the same one can be used for the first encapsulating resin 21 and the second encapsulating resin 22.

According to the fifth embodiment as described above, the semiconductor chip 1 is fixedly secured to the heat spreader 3 and subjected to bonding by the metal thin wires 4. Next, the first encapsulating resin 21 is supplied to and semi-cured within the lower opening 13 except for the neighborhood of the tops of the metal thin wires 4. Thereafter, the parts are sealed with the second encapsulating resin 22 inclusive of the semiconductor chip 1 and the metal thin wires 4. Therefore, the voids are developed only below the semi-cured first encapsulating resin 21, and no voids occur in the neighborhood of the tops of the metal thin wires 4 at which they are easy to remain, thereby exerting no influence on the reliability of the semiconductor device.

Since the encapsulation is done after the bonding using the metal thin wires 4 in the fifth embodiment, the pads won't become dirty and a bad influence on wire bonding can be avoided, thus making it possible to improve the reliability of connections of the wiring portions.

While the present embodiment has been described with the cavity down type BGA package as an illustrative example, it can be similarly applied even to a BGA package of a type wherein a small heat spreader is bonded to a multilayer printed circuit or wiring board and solder balls are provided on the heat spreader side, and an LGA (Land Grid Array) package with no solder balls mounted thereon.

No limitation is imposed on the multilayer wiring board. Even a single-layer wiring board and a double-sided wiring board can be embodied.

As described above, the present invention can implement a semiconductor device excellent in electric characteristics and moisture resistance because the recessed portion of the adhesive is eliminated and the voids are prevented from occurring, or the voids are encapsulated so as not to influence the portion requiring moisture resistance even if they occur.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A semiconductor device, comprising:
   a semiconductor chip;
   metal thin wires respectively connected to electrodes on said semiconductor chip;
   a wiring board having an opening for accommodating said semiconductor chip and being electrically connected to said semiconductor chip by said metal thin wires;
   a heat spreader having a flat principal surface, said semiconductor chip and said wiring board being provided over the flat principal surface;
   a common adhesive layer which is in direct contact with and provided over the principal surface of said heat spreader and is in direct contact with both said semiconductor chip and said wiring board so as to bond both said semiconductor chip and said wiring board to said heat spreader, so that a heat transfer effect between said semiconductor chip and said heat spreader is about equal to a heat transfer effect between said wiring board and said heat spreader; and an encapsulating resin for sealing at least said metal thin wires, wherein said semiconductor chip is disposed in the opening of said wiring board, and is separated from edges of said wiring board that collectively define the opening by a space so that said semiconductor chip does not completely cover said heat spreader within the opening, and wherein a portion of said heat spreader within the opening that is not covered by said semiconductor chip being completely covered by said adhesive layer.

2. The semiconductor device as claimed in claim 1, wherein said adhesive layer covers the entire principle surface of said heat spreader.

3. The semiconductor device as claimed in claim 1, further comprising a second adhesive layer having the same thermal characteristic as said adhesive layer provided over the reverse surface of said heat spreader.

4. The semiconductor device as claimed in claim 3, further comprising a radiating fin provided over said second adhesive layer.

5. A method of manufacturing a semiconductor device, comprising the following steps:

preparing a heat spreader having a flat, principal surface;

forming a common adhesive layer over the principal surface of said heat spreader;

disposing a semiconductor chip and a wiring board over, and in direct contact with, said common adhesive layer, the wiring board having an opening for accommodating said semiconductor chip, said semiconductor chip being disposed in the opening of said wiring board, and being separated from edges of said wiring board that collectively define the opening by a space so that said semiconductor chip does not completely cover said heat spreader within the opening, a portion of said heat spreader within the opening that is not covered by said semiconductor chip being completely covered by said common adhesive layer;

connecting electrodes of said semiconductor chip and said wiring board by metal thin wires; and sealing at least said metal thin wires with an encapsulating resin, wherein the common adhesive layer is utilized to bond both the semiconductor chip and the wiring board to the principal surface of the heat spreader, so that a heat transfer effect between the semiconductor chip and the heat spreader is about equal to a heat transfer effect between the wiring board and the heat spreader.

6. A method of manufacturing a semiconductor device, comprising the following steps:

preparing a heat spreader;

forming a first adhesive layer and a second adhesive layer over a principal surface of said heat spreader;

forming a wiring board over said first adhesive layer, the wiring board having a through opening;

forming a semiconductor chip over said second adhesive layer and disposing the semiconductor chip in the through opening so that all side surfaces of said semiconductor chip are completely surrounded by said wiring board;

connecting electrodes of said semiconductor chip and said wiring board by metal thin wires;

sealing said second adhesive layer and part of said semiconductor chip with a first encapsulating resin; and sealing said metal thin wires and said semiconductor chip with a second encapsulating resin after said first encapsulating resin has been cured;

wherein said connecting electrodes is performed after said sealing said second adhesive layer and part of said semiconductor chip with a said first encapsulating resin, and before said sealing said metal thin wires and said semiconductor chip with said second encapsulating resin.

7. The method as claimed in claim 6, wherein said first encapsulating resin and said second encapsulating resin are respectively encapsulating resins different in material from each other.

8. A method of manufacturing a semiconductor device, comprising the following steps:

preparing a heat spreader;

forming a first adhesive layer and a second adhesive layer over a principal surface of said heat spreader, forming a wiring board over said first adhesive layer, the wiring board having a through opening;

forming a semiconductor chip over said second adhesive layer and disposing the semiconductor chip in the through opening so that all side surfaces of said semiconductor chip are completely surrounded by said wiring board;

connecting electrodes of said semiconductor chip and said wiring board by metal thin wires;

after said electrodes are connected to said wiring board by the metal thin wires, sealing said second adhesive layer and part of said semiconductor chip with an encapsulating resin;

after said encapsulating resin has only partially cured, sealing said metal thin wires and said semiconductor chip with more of said encapsulating resin that was used to seal said second adhesive layer and part of said semiconductor chip; and curing said encapsulating resin.

* * * * *